United States Patent [19]

Takahashi et al.

[11] 3,846,711

[45] Nov. 5, 1974

[54] AUTOMATIC GAIN CONTROL CIRCUIT

[75] Inventors: Kazuya Takahashi, Katsuta; Mitsuya Sato, Tokyo; Kaname Ohta, Katsuta; Tadashi Takamiya, Yokohama, all of Japan

[73] Assignee: Hitachi, Ltd., Tokyo, Japan

[22] Filed: Aug. 7, 1973

[21] Appl. No.: 386,415

[30] Foreign Application Priority Data

Aug. 30, 1972 Japan .............................. 47-86305

[52] U.S. Cl. .................................. 330/29, 330/145

[51] Int. Cl. .............................................. H03g 3/30

[58] Field of Search .................. 330/29, 38 M, 145; 307/237, 264

[56] References Cited

UNITED STATES PATENTS 3,267,388 8/1966 Finkey et al. .................... 330/29 X 3,397,324 8/1968 Fine et al. ........................ 330/29 X

*Primary Examiner*—Herman Karl Saalbach

*Assistant Examiner*—James B. Mullins

*Attorney, Agent, or Firm*—Craig & Antonelli

[57] ABSTRACT

An automatic gain control circuit which includes an amplifier portion for amplifying the automatic gain control signal, an impedance control portion driven by the output of the amplifier portion, a variable impedance portion provided separately from the amplifier portion and controlled by the impedance control portion, and an AC bypass portion arranged on the input side of the impedance control portion, whereby even when the control signal is at a low level, the gain control can be effected at a low distortion factor.

17 Claims, 5 Drawing Figures

*PRIOR ART*

AUTOMATIC GAIN CONTROL CIRCUIT

BACKGROUND OF THE INVENTION

1. Field of the Invention

The present invention relates to an automatic gain control circuit, and more particularly to an automatic gain control circuit suitable for fabrication as an integrated semiconductor circuit.

2. Description of the Prior Art

As shown in FIG. 1, a conventional voice amplifier device is constructed such that a voice input signal supplied to an input terminal IN is amplified by a preamplifier portion A, and the amplified input signal is fed through a power amplifier portion PA to a speaker SP. In this case, a matching transformer T is arranged between the power amplifier portion PA and the speaker SP, so as to effect impedance matching between the amplifier and the speaker. In order to provide automatic gain control, an automatic gain control circuit AGC is arranged between the output side and the input side of the power amplifier portion PA. In the figure, $R_1$ and $R_2$ designate resistances, and $T_1$ – $T_4$ designate terminals of the automatic gain control circuit AGC.

The automatic gain control circuit AGC generally employed in the system of FIG. 1 is composed, as illustrated in FIG. 2, of an n-p-n transistor $Q_1$, and three diodes $D_1$ – $D_3$ which are connected in series in the forward direction to the emitter of the transistor $Q_1$. One end of the diode $D_3$ is grounded through the terminal $T_4$, while the collector of the transistor $Q_1$ is connected to a power source $V_{cc}$ through the terminal $T_1$. Supplied through the terminal $T_2$ to the base of the transistor $Q_1$ is an automatic gain control signal $Sc_1$ which is produced in such a way that an AC signal derived from the output side of the power amplifier portion PA in FIG. 1 is rectified and smoothed by means of a detecting diode $D_4$ and a capacitor $C_1$. The juncture $P_1$ between the diodes $D_1$ and $D_2$ is connected through the terminal $T_3$ as well as a capacitor $C_2$ to the input side of the power amplifier portion PA.

Depending on the magnitude of the control signal $Sc_1$ supplied to the base of the transistor $Q_1$, the impedance of the diodes $D_1$ – $D_3$ varies, so that the impedance component included in the input of the power amplifier portion PA changes. Thus, the gain control of the device is carried out.

With such a construction, gain control is possible with a small control current. Furthermore, the input signal to be controlled is subject to push-pull operation, so that even-order higher harmonics are removed, making gain control with a low distortion factor possible. On the other hand, however, the voltage to be supplied to the base of the transistor $Q_1$ must be made higher than the sum of the rise voltages of the transistor $Q_1$ and the diodes $D_1$ – $D_3$ in order to reduce the distortion attributable to the non-linearity of the rise in the voltage-current characteristics of the transistor $Q_1$ and the diodes $D_1$ – $D_3$. In particular, since the transistor $Q_1$ also has the detecting diode $D_4$ connected on its input side, the effective voltage required for automatic gain control is approximately 3 V or higher.

For this reason, according to the prior art, a special winding for taking out the automatic gain control signal is provided on the secondary side of the matching transformer T disposed on the output side of the power amplifier portion PA.

When it is intended to utilize the automatic gain control circuit AGC of the foregoing construction with a voice amplifier device of the OTL system, the voltage for automatic gain control cannot be set to a high level, as a result of which the circuit is subjected to an increased distortion.

SUMMARY OF THE INVENTION

It is therefore a principal object of the present invention to provide an automatic gain control circuit which enables gain control with a low distortion factor even with a control signal of low level.

Another object of the present invention is to provide an automatic gain control circuit which is suitable to be provided in the form of an integrated semiconductor circuit.

In order to accomplish such objects, the present invention consists of a circuit in which an automatic gain control signal is amplified after detection. The amplifier portion therefor and a variable impedance portion are separated, the latter being controlled by an impedance control portion which is driven by the output of the amplifier portion.

PREFERRED EMBODIMENTS OF THE INVENTION

Figure 1:
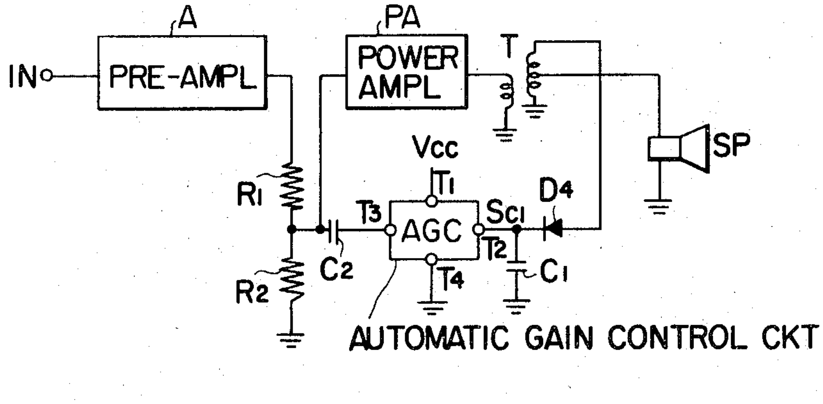
FIG. 1 PRIOR ART
FIG. 1 is a schematic circuit diagram already referred to, showing an example of a prior-art voice amplifier device.
Figure 2:
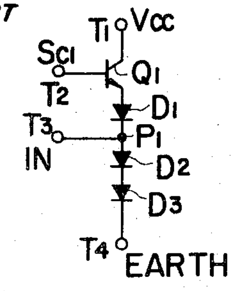
FIG. 2 PRIOR ART
FIG. 2 is a schematic circuit diagram already referred to, showing an example of the automatic gain control circuit in FIG. 1.
Figure 3:
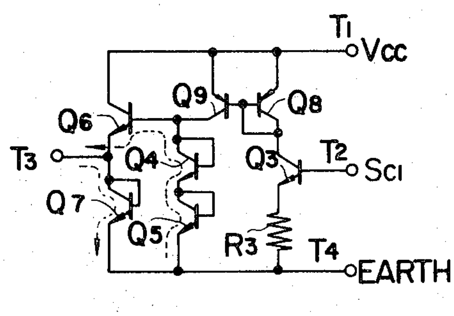
FIGS. 3 to 5 are schematic circuit diagrams each showing a respective embodiment of the automatic gain control circuit according to the present invention.

FIG. 3 shows an embodiment of the automatic gain control circuit according to the present invention. In the figure, $Q_3$ – $Q_7$ designate n-p-n transistors, $Q_8$ and $Q_9$ designate p-n-p transistors, and $R_3$ designates a resistance. The transistor $Q_3$ constituting an amplifier portion for an automatic gain control signal has its emitter connected through the resistance $R_3$ to a terminal $T_4$ leading to ground, and has its collector connected through the collector and emitter of the transistor $Q_8$ to a power source terminal $T_1$. The base of the transistor $Q_8$ is connected to its collector electrode and to the base of the transistor $Q_9$. The emitter of the transistor $Q_9$ is connected to the power source terminal $T_1$, while the collector is connected to the base of the transistor $Q_6$ constituting an impedance control portion. The collector of the transistor $Q_6$ is connected to the power source terminal $T_1$, while the emitter is connected to a terminal $T_3$ (on the input side of the power amplifier portion in FIG. 1) and also to ground at the terminal $T_4$ through the collector-emitter junction of the transistor $Q_7$. The transistor $Q_7$ has its base connected to its collector, thus constituting a variable impedance diode. Further, the transistors $Q_4$ and $Q_5$ are connected in series with their respective bases connected to their collectors. Thus, they constitute AC bypass diodes. The collector of the transistor $Q_4$ is connected to the collector of the transistor $Q_9$, while the emitter of the transistor $Q_5$ is connected to ground at the terminal $T_4$.

With such a construction, the detected automatic gain control signal $Sc_1$ applied to the terminal $T_2$ (the input terminal of the automatic gain control circuit) is sufficiently DC-amplified by the transistor $Q_3$. The amplified signal is applied through the transistors $Q_8$ and $Q_9$ to the base of the transistor $Q_6$. Accordingly, a voltage sufficiently higher than the rise voltage $V_F$ of the transistor $Q_6$ is applied to the transistor $Q_7$ which is connected on the emitter side of the transistor $Q_6$ and which constitutes a variable impedance diode. For this reason, the transistor $Q_7$ operates in an operating region of little non-linear distortion. In consequence, even if the automatic gain control signal $Sc_1$ applied to the terminal $T_2$ is at a low level, a gain control of low distortion factor can be effected.

Across the transistors $Q_4$ and $Q_5$ connected in series and respectively constituting the AC bypass diodes, there is applied a voltage which is higher than double the rise voltage $V_F$. The dynamic resistances of these transistors $Q_4$ and $Q_5$ are accordingly very small, so that the base of the transistor $Q_6$ for controlling the gain is grounded AC-wise. Consequently, the transistors $Q_6$ and $Q_7$ can effect a substantially perfect push-pull operation for the input signal to-be-controlled. For this reason, even if the automatic gain control signal is at a low input level, it is possible to achieve a low distortion factor.

With the construction of the present invention as described above, even though the detector portion including diode $D_4$ for detecting the signal derived from transformer T for automatic gain control and the impedance control portion formed by the transistor $Q_6$ are separated by the amplifier portion formed by transistor $Q_3$, the previously required capacitor $C_1$ of the detector portion is not necessary since the AC bypass diodes composed of the transistors $Q_4$ and $Q_5$ are employed. Accordingly, if the automatic gain control circuit is constructed as an integrated semiconductor circuit (IC), terminals otherwise fitted outside the IC device for connecting such a capacitor are unnecessary, and therefore, the number of terminals required for external connection to the IC device need not be especially increased.

Figure 4:
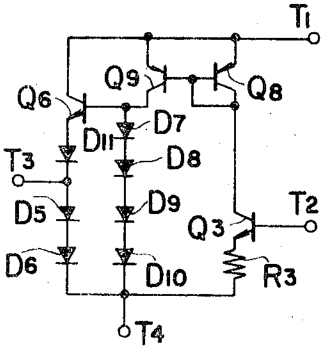

FIG. 4 shows another embodiment of the automatic gain control circuit according to the present invention. In this case, diodes $D_5$ and $D_6$ are employed in place of the transistor $Q_7$ in FIG. 3, and diodes $D_7 - D_{10}$ are used in place of the transistors $Q_4$ and $Q_5$. With such a construction, the rise of the voltage-current characteristic of the diodes $D_5$ and $D_6$ constituting variable impedance diodes becomes smaller than in the case of the circuit of FIG. 3. This results in less distortion.

Herein, a diode $D_{11}$ is connected to the emitter side of the transistor $Q_6$, so that, when the transistor $Q_6$ and the diodes $D_5$ and $D_6$ perform the push-pull operation for the input signal to-be-controlled, the impedances for the positive and negative cycles of the input signal to-be-controlled may be matched to reduce the distortion.

The four diodes $D_7 - D_{10}$ constituting AC bypass diodes are employed so that the base of the transistor $Q_6$ can be grounded AC-wise by making the sum of the rise voltages of the transistor $Q_6$ and the diodes $D_{11}$, $D_5$ and $D_6$ and the sum of the rise voltages of the diodes $D_7 - D_{10}$ substantially equal. The AC resistance of these diodes $D_7 - D_{10}$ is selected to be sufficiently smaller than the AC resistance of the transistor $Q_6$ and the diode $D_{11}$ or that of the diodes $D_5$ and $D_6$.

Figure 5:
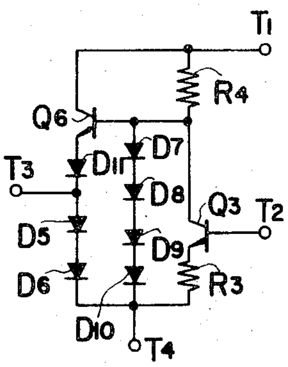

FIG. 5 shows still another embodiment of the automatic gain control circuit according to the present invention. In this case, a load resistance $R_4$ is substituted for the transistors $Q_8$ and $Q_9$ in FIG. 4. Even with such a construction, substantially the same operation as in the foregoing cases can be effected.

Although, in the embodiments described above, the bipolar transistor is employed as the impedance control portion, it may, of course, be replaced with a MOS field-effect transistor.

Although, in the embodiments, the transistors or usual diodes having rise voltages are used as the AC bypass portion, it may be constituted of any semiconductor device having a rise voltage. For example, a Zener diode may also be used. In this case, the semiconductor device should preferably have the lowest possible AC resistance in a region of voltages above the rise voltage.

Although, in the embodiments, the transistor or usual diodes having rise voltages are employed as the variable impedance portion as in the AC bypass portion referred to above, they may be replaced with any other semiconductor device having a rise voltage.

As described above, in accordance with the automatic gain control circuit of the present invention, a gain control of low distortion factor can be effected even for an automatic gain control signal of low level. Besides, when the present invention is applied to a voice amplifier device of, for example, the OTL system which employs an integrated semiconductor circuit, a capacitor between the automatic gain control circuit and the power amplifier portion can be dispensed with. It is therefore possible to decrease the number of terminals to be externally provided for the integrated circuit, and to obtain miniaturization of the device.

What is claimed is:

1. An automatic gain control circuit comprising amplifier means for amplifying an automatic gain control signal, variable impedance means having a non-linear voltage characteristic for providing a varying impedance in response to the amplified automatic gain control signal, an impedance control circuit connecting the output of said amplifier means to said variable impedance means, and bypass means including a plurality of forward biased PN junction devices series connected to the input of said impedance control circuit and having a non-linear voltage characteristic for bypassing AC signal components to ground.

2. An automatic gain control circuit as defined in claim 1, wherein said amplifier means includes a voltage source, a first transistor connected to said voltage source and having its input electrode connected to an input terminal receiving said automatic gain control signal.

3. An automatic gain control circuit as defined in claim 2, wherein said amplifier means further includes a second transistor connected between said first transistor and said impedance control circuit.

4. An automatic gain control circuit as defined in claim 2, wherein said amplifier means further includes a first resistor connected between said first transistor and said voltage source and a second resistor connected between said first transistor and ground.

5. An automatic gain control circuit as defined in claim 4, wherein said impedance control circuit includes a second transistor connected between said voltage source and an output terminal and having an input electrode connected to the output of said amplifier means.

6. An automatic gain control circuit as defined in claim 5, wherein said impedance control circuit further includes a diode connected between said second transistor and said output terminal.

7. An automatic gain control circuit as defined in claim 6, wherein said variable impedance means includes a first pair of diodes connected in series between said output terminal and ground.

8. An automatic gain control circuit as defined in claim 7, wherein said PN junction devices of said bypass means include second and third pairs of series connected diodes connected in series between the input electrode of said third transistor and ground.

9. An automatic gain control circuit as defined in claim 1, wherein said PN junction devices of said bypass means include a plurality of diodes connected in series between the input of said impedance control circuit and ground.

10. An automatic gain control circuit as defined in claim 1, wherein the number of PN junction devices provided in said bypass means is equal to the number of forward biased PN junctions comprised in said variable impedance means and said impedance control circuit.

11. An automatic gain control circuit comprising amplifier means for amplifying an automatic gain control signal, variable impedance means having a non-linear voltage characteristic for providing a varying impedance in response to the amplified automatic gain control signal, an impedance control circuit connecting the output of said amplifier means to said variable impedance means, and bypass means connected to the input of said impedance control circuit and having a non-linear voltage characteristic for bypassing AC signal components to ground, wherein said impedance control circuit includes a first transistor connected between a voltage source and an output terminal and having an input electrode connected to the output of said amplifier means, said variable impedance means being connected to said output terminal in series with said impedance control circuit across said voltage source.

12. An automatic gain control circuit as defined in claim 11, wherein said impedance control circuit further includes a diode connected between said first transistor and said output terminal.

13. An automatic gain control circuit as defined in claim 11, wherein said variable impedance means includes a second transistor connected between said output terminal and ground, the base of said second transistor being connected to the collector thereof.

14. An automatic gain control circuit as defined in claim 13, wherein said bypass means includes third and fourth transistors connected in series and each having its base connected to its collector.

15. An automatic gain control circuit as defined in claim 11, wherein said variable impedance means includes a first pair of diodes connected in series between said output terminal and ground.

16. An automatic gain control circuit as defined in claim 15, wherein said bypass means includes second and third pairs of series connected diodes connected in series between the input electrode of said first transistor and ground.

17. An automatic gain control circuit as defined in claim 11, wherein said variable impedance means includes a first pair of diodes connected in series between said output terminal and ground.

* * * * *